United States Patent
Nachumovsky

(10) Patent No.: US 6,218,695 B1
(45) Date of Patent: Apr. 17, 2001

(54) AREA EFFICIENT COLUMN SELECT CIRCUITRY FOR 2-BIT NON-VOLATILE MEMORY CELLS

(75) Inventor: Ishai Nachumovsky, Zichron Yaakov (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/340,979

(22) Filed: Jun. 28, 1999

(51) Int. Cl.[7] ................................................. H01L 27/108
(52) U.S. Cl. ................... 257/296; 257/314; 365/185.13; 365/185.2; 365/185.33; 365/103; 365/63
(58) Field of Search ........................ 365/185.01, 185.28, 365/185.18, 185.24, 103, 185.13, 185.2, 185.6, 185.33, 63; 257/296, 314, 315, 324, 637, 640, 648

(56) References Cited

U.S. PATENT DOCUMENTS

| | | | |
|---|---|---|---|
| 4,263,664 | * 4/1981 | Owen et al. | 365/185 |
| 4,393,481 | * 7/1983 | Owen et al. | 365/228 |
| 4,912,348 | * 3/1990 | Maki et al. | 326/113 |
| 5,471,087 | * 11/1995 | Buerger, Jr. | 257/532 |
| 5,719,817 | * 2/1998 | Schaefer | 365/230.03 |
| 5,768,192 | 6/1998 | Eitan . | |
| 6,091,633 | * 7/2000 | Cernea et al. | 365/185.13 |

* cited by examiner

Primary Examiner—Olik Chaudhuri
Assistant Examiner—Ginette Peralta
(74) Attorney, Agent, or Firm—Bever, Hoffman & Harms, LLP; Patrick T. Bever

(57) ABSTRACT

A memory circuit that includes a series of parallel elongated diffusion bit lines and an array of 2-bit non-volatile memory cells connected between the diffusion bit lines. Column select circuits are located at the ends of the diffusion bits lines that selectively connect the diffusion bit lines to a bit line decoder circuit to read appropriate signals from selected memory cells. A series of metal jumpers extend over and connect the ends of the diffusion bit lines. By connecting both ends of the diffusion bit lines together, the metal jumpers allow the diffusion bit lines to be longer without increasing resistance, so that a single pair of column select circuit control a large number of memory cells to increase the area efficiency of the memory array. Conversely, the metal jumpers reduce the resistance in shorter diffusion bit lines, thereby increasing memory array endurance.

18 Claims, 10 Drawing Sheets

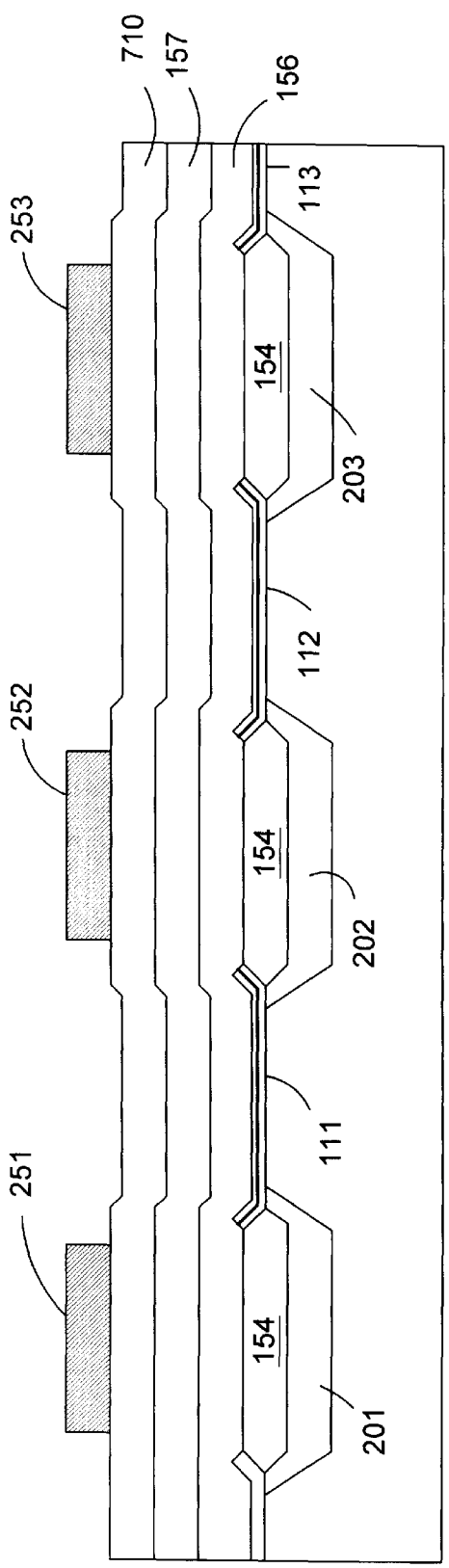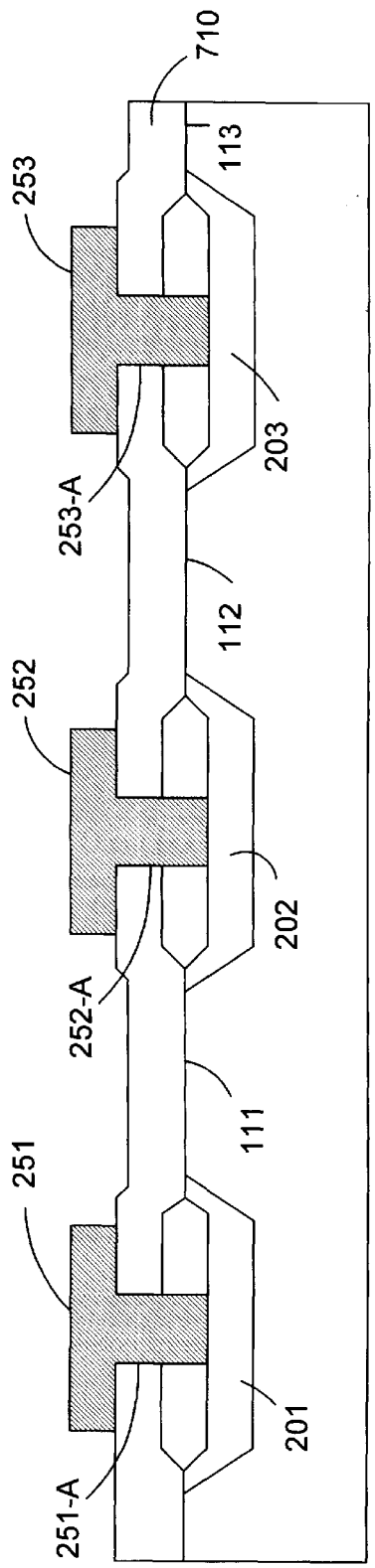
FIG. 7 (A)
FIG. 7 (B)

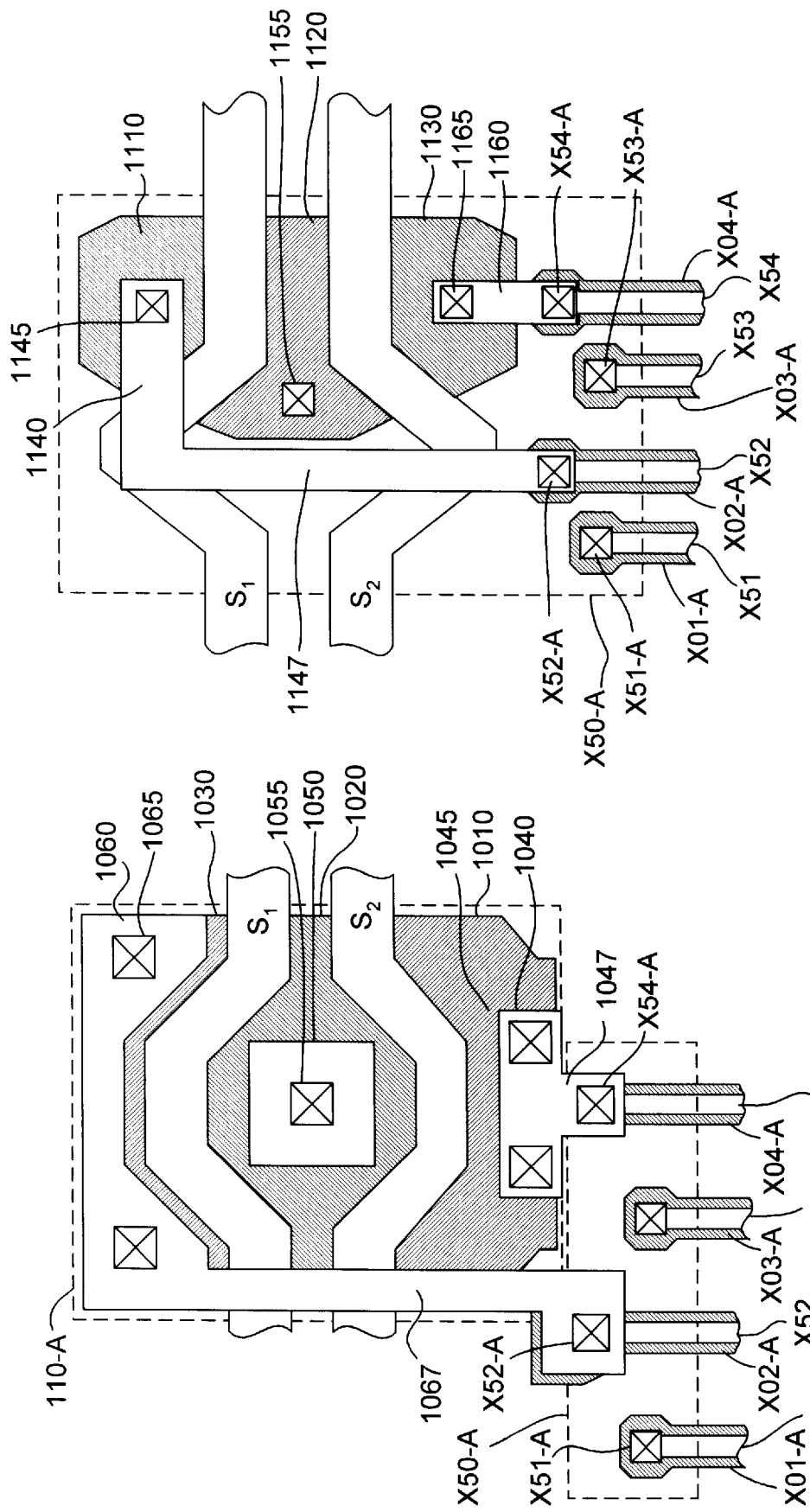

AREA EFFICIENT COLUMN SELECT CIRCUITRY FOR 2-BIT NON-VOLATILE MEMORY CELLS

FIELD OF THE INVENTION

The present invention relates to non-volatile memory cells. More specifically, the present invention relates to a column select circuitry for 2-bit non-volatile memory cells.

RELATED ART

FIG. 1 is a cross sectional view of a conventional 1-bit non-volatile semiconductor memory cell 10 that utilizes asymmetrical charge trapping. 1-bit memory cell 10, which is fabricated in p-type substrate 12, includes n+source region 14, n+drain region 16, channel region 17, silicon oxide layer 18, silicon nitride layer 20, silicon oxide layer 22, and control gate 24. Oxide layer 18, nitride layer 20 and oxide layer 22 are collectively referred to as ONO layer 21. Memory cell 10 operates as follows. A programming operation is performed by connecting source region 14 to ground, connecting drain region 16 to a programming voltage of about 9 Volts, and connecting control gate 24 to a voltage of about 10 Volts. As a result, electrons are accelerated from source region 14 to drain region 16. Near drain region 16, some electrons gain sufficient energy to pass through oxide layer 18 and be trapped in nitride layer 20 in accordance with a phenomenon known as hot electron injection. Because nitride layer 20 is non-conductive, the injected charge remains localized within charge trapping region 26 in nitride layer 20.

Memory cell 10 is read by applying 0 Volts to the drain region 16, 2 Volts to the source region 14, and 3 Volts to the gate electrode. If charge is stored in charge trapping region 26 (i.e., memory cell 10 is programmed), then memory cell does not conduct current under these conditions. If there is no charge stored in charge trapping region 26 (i.e., memory cell 10 is erased), then memory cell 10 conducts current under these conditions. The current, or lack of current, is sensed by a sense amplifier to determine the state of memory cell 10.

Note that the polarity of the voltage applied across source region 14 and drain region 16 is reversed during the program and read operations. That is, memory cell 10 is programmed in one direction (with source region 14 grounded), and read the opposite direction (with drain region 16 grounded). As a result, the read operation is referred to as a reverse read operation. Memory cell 10 is described in more detail in U.S. Pat. No. 5,768,192.

Memory cell 10 can also be controlled to operate as a 2-bit non-volatile semiconductor memory cell. To accomplish this, memory cell 10 is controlled to use a second charge trapping region in nitride layer 20, which is located adjacent to source region 14. FIG. 2 illustrates both the first charge trapping region 26 (described above in connection with FIG. 1), and the second charge trapping region 28 in dashed lines. The second charge trapping region 28 is used to store a charge representative of a second bit. The second charge trapping region 28 is programmed and read in a manner similar to the first charge trapping region 26. More specifically, the second charge trapping region 28 is programmed and read by exchanging the source and drain voltages described above for programming and reading the first charge trapping region 26. Thus, the second charge trapping region 28 is programmed by applying 0 Volts to drain region 16, applying 9 Volts to source region 14 and applying 10 Volts to control gate 24. Similarly, the second charge trapping region 28 is read by applying 0 Volts to source region 14, 2 Volts to drain region 16, and 3 Volts to control gate 24.

Note that because nitride layer 20 is non-conductive, the charges stored in the first and second charge trapping regions 26 and 28 remain localized within nitride layer 20. Also note that the state of the first charge trapping region 26 does not interfere with the reading of the charge stored in the second charge trapping region 28 (and vice versa). Thus, if the first charge trapping region 26 is programmed (i.e., stores charge) and the second charge trapping region 28 is not programmed (i.e., does not store charge), then a reverse read of the first charge trapping region will not result in significant current flow. However, a reverse read of the second bit will result in significant current flow because the high voltage applied to drain region 16 will result in punch through in the channel region adjacent to first charge trapping region 26. Thus, the information stored in the first and second charge trapping regions 26 and 28 is read properly.

Similarly, if both the first and second charge trapping regions are programmed, neither reverse read operation results in significant current flow. Finally, if neither the first charge trapping region 26 nor the second charge trapping region 28 is programmed, then both reverse read operations result in significant current flow.

Memory arrays that include 2-bit memory cells of the type described above are typically formed in blocks, each block including several 2-bit memory cells connected between parallel elongated diffused (e.g., n+) regions. The signals applied to or read from the memory cells are transmitted through the diffusion regions, which act as bit lines. A problem arises when the resistance of these diffusion bit lines affects the voltages applied to or read from the 2-bit memory cells. For example, this diffusion bit line resistance creates a back-bias effect that negatively affects programming operations. The length of the diffusion regions is limited to a relatively short length to minimize this problem (i.e., by minimizing the resistance introduced by the diffusion bit lines). However, only a limited number of memory cells can be connected to these relatively short diffusion bit lines, thereby restricting the area efficiency of the memory array architecture.

What is needed is a structure that increases the number of 2-bit memory cells that are connected to the diffusion bit lines without affecting the signals applied to or read from the 2-bit memory cells.

SUMMARY

Accordingly, the present invention provides a memory circuit (flash and EEPROM) that incorporate 2-bit non-volatile memory transistors coupled between elongated diffusion bit lines, and metal jumpers that periodically contact each elongated diffusion bit line to provide a low resistance signal path. The diffusion bit lines are connected between column select circuits that include select transistors for selectively connecting the diffusion bit lines to metal bit lines of the memory circuit. Each metal jumper extends over an associated elongated diffusion bit line, and is connected by periodically-spaced vias formed through an insulation layer located between the metal jumper and the elongated diffusion bit line.

According to one aspect of the present invention, by providing a metal jumper over each elongated diffused region, significantly longer diffusion bit lines are formed that have comparable resistance to shorter conventional ("jumperless") diffusion bit lines. Consequently, the number of charge storage regions connected along each diffused region is significantly increased, thereby allowing a single pair of column select circuits to control a larger number of memory cells. By increasing the number of memory cells while maintaining the same number of select transistors, the area efficiency of memory arrays incorporating these longer diffusion bit lines is greatly increased over conventional ("jumperless") arrangements.

According to another aspect of the present invention, the metal jumpers provide significantly reduced diffusion bit line resistance, thereby providing greater control over the signals applied to the memory cells. Connecting a metal jumper at both ends of a diffusion bit line reduces the resistance of the diffusion bit line. This lower resistance allows very precise control over the signals (voltages) applied to the 2-bit memory cells during programming and erasing operations. By precisely controlling these applied signals, the memory cells are able to tolerate greater cycling, thereby improving the endurance of the memory cells.

The basic structure of each memory block includes a first column select circuit, a second column select circuit, and a memory array located between the first and second column select circuits. Each of the first and second column select circuits include several select transistors, and each select transistor is connected between a metal bit line and a diffusion bit line of the memory array. The metal bit lines are used to transmit signals from the memory block to, for example, a bit line decoder connected to the memory block. The select transistors are controlled to transmit signals between the metal bit lines and the diffusion bit lines during read, program and erase operations. The memory array also includes a plurality of 2-bit non-volatile memory cells that are connected to the diffusion bit lines. These memory cells are programmed or erased in response to voltages transmitted from the metal bit line to the diffusion bit line through the select transistor. Conversely, data values stored on these memory cells are transmitted to the metal bit lines through the select transistors during read operations.

In accordance with a first embodiment of the present invention, a memory block includes diffusion bit lines having first ends located adjacent to a first column select circuit and second ends located adjacent to a second column select circuit, and metal jumpers that extend over and connect both ends of the diffusion bit lines. Each diffusion bit line is also connected to an associated select transistor. Each metal jumper provides a low resistance path between the select transistor and the first and second ends of each diffusion bit line, thereby reducing the resistance imposed on signals transmitted through the diffusion bit line from the memory cells connected to the diffusion bit line. For example, signals transmitted from memory cells located midway between the first and second ends of the diffusion bit line incur parallel resistances, each resistance equal to one-half of the diffusion bit line length. Therefore, the metal jumper allows the diffusion bit line to be essentially four times as long as that of conventional (jumperless) arrangements, thereby providing greater area efficiency over these conventional arrangements.

In accordance with a second embodiment of the present invention, a memory block includes pairs of diffusion bit lines that are aligned end-to-end between the first column select circuit and the second column select circuit, and metal jumpers that are connected between the first and second diffusion bit lines of each pair. The first diffusion bit line of each pair is connected at a first end to a select transistor. The second diffusion bit line of each pair has a first end located adjacent to a second end of the first diffusion bit line. Each metal jumper is connected to the first ends of the first and second diffusion bit lines of an associated pair, thereby providing a low resistance path between the first and second diffusion bit lines and the select transistor. Similar to the first embodiment, by providing several diffusion bit lines between the first and second column select circuits, many more memory cells can be accessed by the select circuits than is possible with conventional (jumperless) arrangements, thereby providing greater area efficiency.

These and other aspects of the present invention will be more fully understood in view of the following description and drawings.

BRIEF DESCRIPTION OF THE DRAWINGS

FIGS. 7(A) and 7(B) are simplified cross-sectional views showing portions of the memory block shown in FIG. 6.

FIG. 10 is a plan layout view showing a column select circuit according to an embodiment of the present invention.

FIG. 11 is a plan layout view showing a column select circuit according to another embodiment of the present invention.

DETAILED DESCRIPTION

Figure 1:
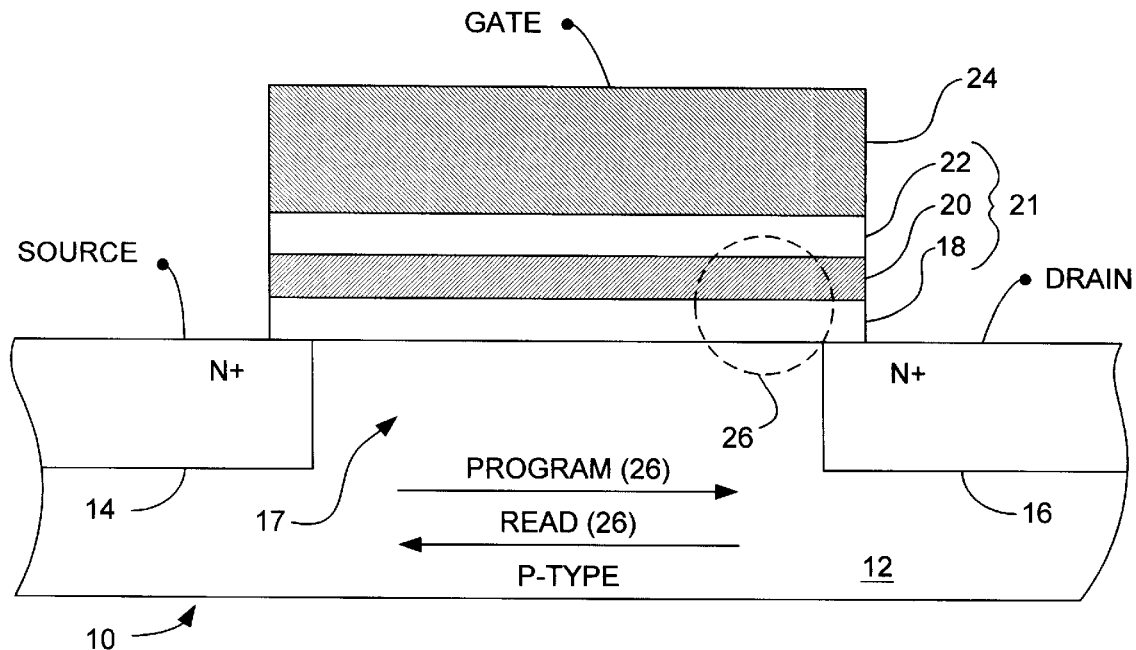
FIG. 1 is a cross sectional diagram illustrating a conventional 1-bit non-volatile memory cell.
Figure 2:
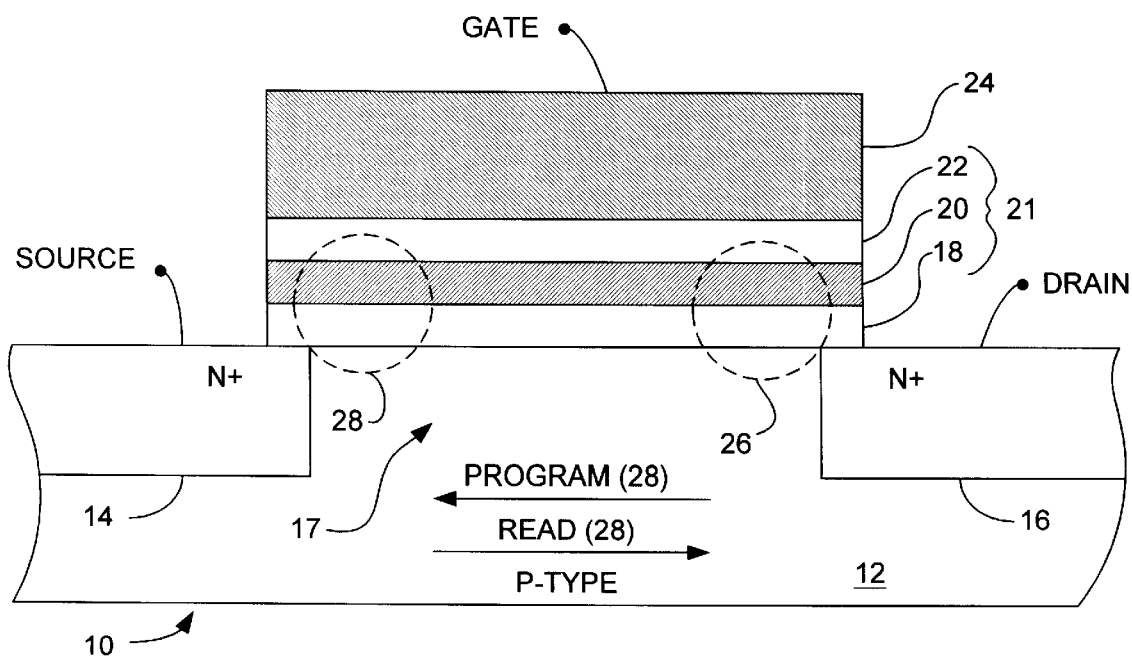
FIG. 2 is a cross sectional diagram illustrating a conventional 2-bit non-volatile memory cell.

The present invention is directed to a memory circuit incorporating 2-bit non-volatile memory cells identical to 2-bit memory cell 10 (see FIG. 2). In particular, the present invention is directed to a metal jumper arrangement for such memory circuits that connects selected regions of one or more diffusion bit lines. The metal jumper arrangement of the present invention achieves area efficiency by increasing diffusion bit line length and minimizing the number of column select circuits in the memory block, thereby maximizing the proportional amount of area available for memory cells. Alternatively, the present invention achieves improved cycling by providing lower diffusion resistances and better control of source potentials during erasing and programming operations, thereby increasing memory cell endurance.

The following description is divided into three parts. First, an introduction to basic memory block components is provided that includes a description of 2-bit non-volatile memory cell operation. Second, definitions are provided to facilitate the description of the present invention. Finally, area efficient memory blocks are described that illustrate the novel aspects of the present invention.

Basic Memory Block Components

Figure 3:
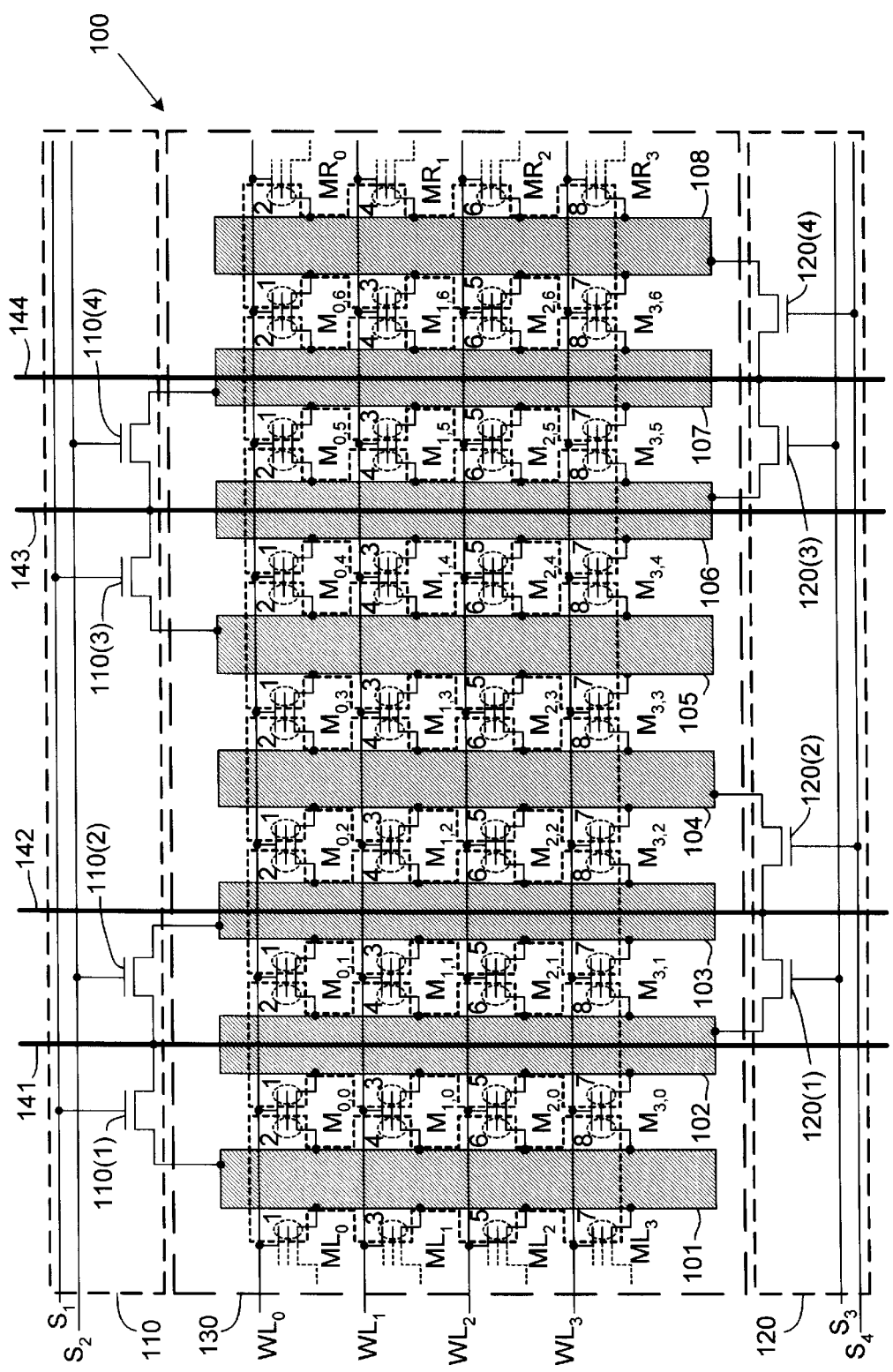
FIG. 3 is a schematic diagram illustrating a memory block that uses the 2-bit memory cells of FIG. 2.

FIG. 3 is a schematic diagram illustrating a memory block 100 that uses a plurality of 2-bit memory cells identical to 2-bit memory cell 10 (FIG. 2). Memory block 100 includes a first column select circuit 110, a second column select circuit 120, and an array 130 of memory cells arranged in rows and columns and located between column select circuits 110 and 120.

Memory array 130 includes seven columns of memory cells, two columns of memory cells that are shared with adjacent memory blocks, and, in this example, four rows of memory cells. The rows extend along a first (e.g., horizontal) axis, and the columns extend along a second (e.g., vertical) axis, perpendicular to the first axis. The memory cells in the seven columns are identified as memory cells $M_{x,y}$, where X and Y represent the row and column locations, respectively, of the memory cells within memory array 130. The shared memory cells on the left border of memory array 130 are identified as memory cells $ML_x$, and the shared memory cells on the right border of memory array 130 are identified as memory cells $MR_x$. Thus, memory block includes memory cells $M_{0,0}$–$M_{3,6}$ and shared memory cells $ML_0$–$ML_3$ and $MR_0$–$MR_3$.

The source and drain regions of memory cells $M_{0,0}$–$M_{3,6}$ are formed by diffused regions 101–108, which extend in parallel along the second axis. As described in more detail below, diffused regions 101–108 also operate as bit lines within memory array 130. Consequently, diffused regions 101–108 are sometimes hereinafter referred to as diffusion bit lines.

The ONO structures of memory cells $M_{x,y}$ are located between adjacent diffusion bit lines 101–108. For example, the ONO structure of memory cell $M_{0,0}$ is located between diffusion bit lines 101 and 102, and the ONO structure of memory cell $M_{0,1}$ is located between diffusion bit lines 102 and 103. The ONO structure of each memory cell forms two charge trapping regions. For example, memory cell $M_{0,0}$ includes a right charge trapping region 1 located adjacent to diffused region 102, and a left charge trapping region 2 located adjacent to diffused region 101. Similarly, memory cell $M_{0,1}$ includes a right charge trapping region 1 connected to diffused region 103, and a left charge trapping region 2 connected to diffused region 102.

The gates of the memory cells in each row are commonly connected to an associated one of word lines $WL_0$–$WL_3$. For example, the row containing memory cells $M_{0,0}$, $M_{0,1}$, $M_{0,2}$, $M_{0,3}$, $M_{0,4}$, $M_{0,5}$, $M_{0,6}$, $ML_0$ and $MR_0$ are controlled by word line $WL_0$. In particular, charge trapping regions 1 and 2 of each of these memory cells are controlled by word line $WL_0$. Similarly, the charge trapping regions 3 and 4 of memory cells $M_{1,0}$–$M_{1,6}$, $ML_1$ and $MR_1$ are controlled by word line $WL_1$, charge trapping regions 5 and 6 of memory cells $M_{2,0}$–$M_{2,6}$, $ML_2$ and $MR_2$ are controlled by word line $WL_2$, and charge trapping regions 7 and 8 of memory cells $M_{3,0}$–$M_{3,6}$, $ML_3$ and $MR_3$ are controlled by word line $WL_3$.

Figure 4A:
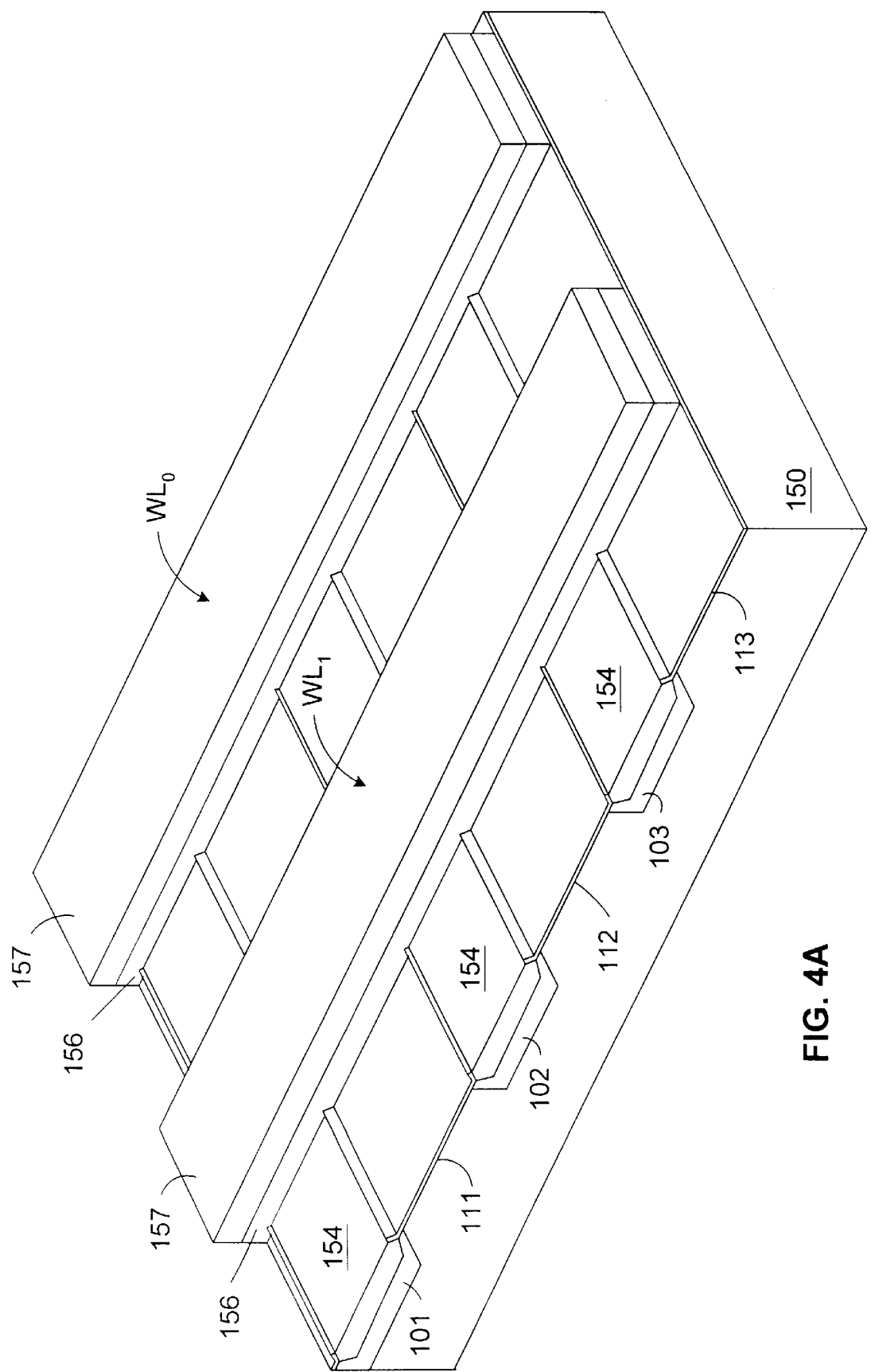
FIG. 4A is an isometric view of memory cells of the memory block of FIG. 3.
Figure 4B:
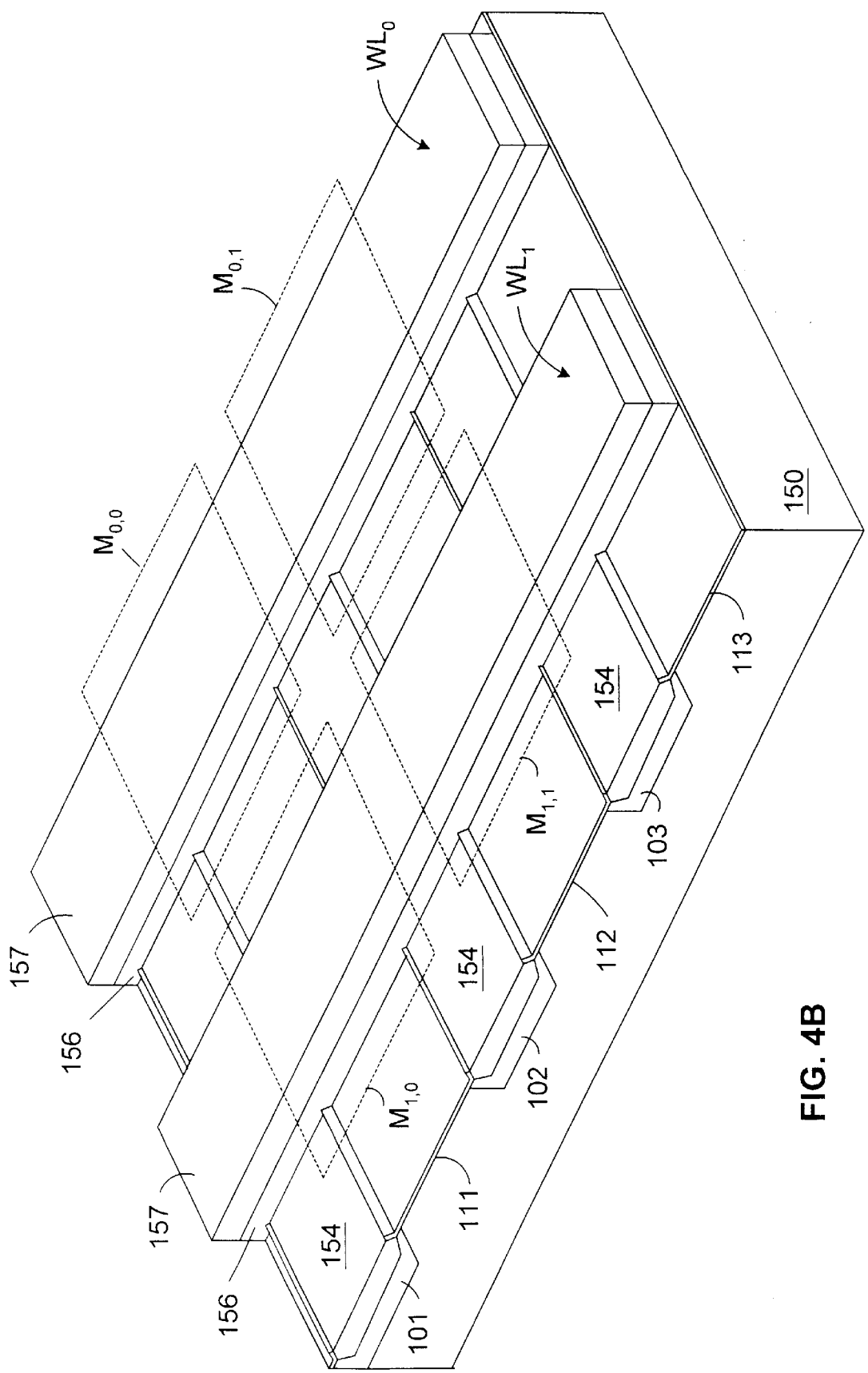
FIG. 4B illustrates the same isometric view as FIG. 4A, with the locations of the memory cells highlighted in dashed lines.
Figure 5:
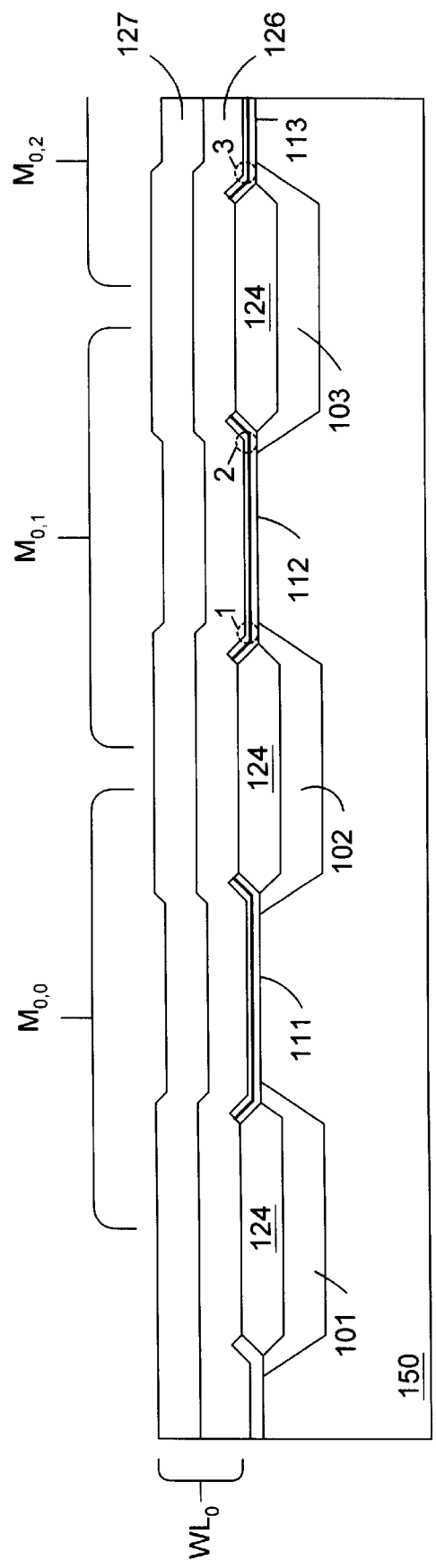
FIG. 5 is a cross sectional view of selected memory cells of FIG. 4A, taken along a word line.

FIG. 4A is an isometric view of memory cells $M_{0,0}$, $M_{0,1}$ $M_{1,0}$, and $M_{1,1}$. FIG. 4B illustrates the same isometric view as FIG. 4A, with the locations of memory cells $M_{0,0}$, $M_{0,1}$, $M_{1,0}$, and $M_{1,1}$ highlighted in dashed lines. FIG. 5 is a cross sectional view of memory cells $M_{0,0}$ and $M_{0,1}$ along the first axis through word line $WL_0$. Diffusion bit lines 101–103 are n-type regions formed in a p-type silicon semiconductor substrate 150. Diffusion bit lines 101–103 can also be formed in a p-well region. Bit line insulating regions 154 are formed over the diffusion bit lines 101–103. Bit line insulating regions 154 can be, for example, silicon oxide having a thickness of approximately 600 Å. Note that bit line insulating regions 154 are an order of magnitude thinner than conventional field oxide. ONO structures 111 and 112 extend over bit line insulating regions 154, diffusion bit lines 101–103 and substrate 150 in the manner illustrated. Word lines $WL_0$ and $WL_1$, which are polycide or salicide structures that include a layer of conductively doped polycrystalline silicon 156 and an overlying layer of metal silicide 157, extend over ONO structures 111 and 112 (and bit line insulating regions 154). Word lines $WL_0$ and $WL_1$ form the control gates of memory cells $M_{0,0}$, $M_{0,1}$ $M_{1,0}$, and $M_{1,1}$. The above-described structures of memory array 130 are fabricated using well-known CMOS processing steps.

Returning to FIG. 3, the 2-bit memory cells of memory array 130 are accessed from a set of metal bit lines 141–144 during read, program and erase operations through column select circuits 110 and 120. Column select circuit 110 includes four high-voltage select transistors 110(1)–110(4), and column select circuit 120 includes high-voltage select transistors 120(1)–120(4). High-voltage select transistors 110(1)–110(4) and 120(1)–120(4) are designed to have gate oxide sufficient to withstand the high voltages transmitted from metal bit lines 141–144 during programming and erasing the memory cells. Select transistors 110(1)–110(4) and 120(1)–120(4) are controlled by signals transmitted on select lines $S_1$–$S_4$ to selectively connect metal bit lines 141–144 to diffusion bit lines 101–108. The first power terminals of select transistors 110(1)–110(4) are coupled to diffusion bit lines 101, 103, 105 and 107, respectively, and the first power terminals of select transistors 120(1)–120(4) are coupled to diffusion bit lines 102, 104, 106 and 108, respectively. The second power terminals of select transistors 110(1) and 110(2) are coupled to metal bit line 141. The second power terminals of select transistors 120(1) and 120(2) are coupled to metal bit line 142. The second power terminals of select transistors 110(3) and 110(4) are coupled to metal bit line 143. The second power terminals of select transistors 120(3) and 120(4) are coupled to metal bit line 144. The gates of select transistors 110(1) and 110(3) are commonly connected to a first select line $S_1$, while the gates of select transistors 110(2) and 110(4) are commonly connected to a second select line $S_2$. Similarly, the gates of select transistors 120(1) and 120(3) are commonly connected to a third select line $S_3$, while the gates of select transistors 120(2) and 120(4) are commonly connected to a fourth select line $S_4$.

The memory cells in memory array 130 are accessed as follows. Two of the select lines $S_1$–$S_4$ are pulled high, thereby turning on the select transistors coupled to these two select lines, and two of the select lines $S_1$–$S_4$ are pulled low, thereby turning off the select transistors coupled to these two select lines. The turned on select transistors couple two columns of memory cells to the metal bit lines 141–144.

For example, when select lines $S_2$ and $S_3$ are pulled high, and select lines $S_1$ and $S_4$ are pulled low, metal bit lines 141–142 are coupled to access the second column of memory cells, and metal bit lines 143–144 are coupled to access the seventh column of memory cells. More specifically, the logic high select lines $S_2$ and $S_3$ cause select transistors 110(2), 120(1), 110(4) and 120(3) to turn on, and the logic low select lines $S_1$ and $S_4$ cause select transistors 110(1), 120(2), 110(3) and 120(4) to turn off. Consequently, diffusion bit line 102 is coupled to metal bit line 142 and diffusion bit line 103 is coupled to metal bit line 141. Similarly, diffusion bit line 106 is coupled to metal bit line 144 and diffusion bit line 107 is coupled to metal bit line 143. As a result, signals provided on metal bit lines 141 and 142 are provided to control the memory cells in the second column of memory array 130, and signals provided on metal bit lines 143 and 144 are provided to control the memory cells in the seventh column of memory array 130.

A plurality of memory blocks, identical to memory block 100 can be coupled together along the first (horizontal) axis, thereby forming a larger memory block. Shared memory cells are formed at the interfaces between memory blocks along the first axis. More specifically, the right-most shared memory cells $MR_0$–$MR_{31}$ and $MR_S$ of one memory block combine with the left-most shared memory cells $ML_0$–$ML_{31}$ and $ML_S$ of an adjacent memory block to form another column of memory cells. Stated another way, the right-most diffusion bit line of one memory block combines with the left-most diffusion bit line of an adjacent memory block to form a shared column of memory cells. This shared column of memory cells is accessed by the right-most metal bit line in a memory block and the left-most metal bit line in the right-adjacent memory block. This shared column of memory cells is accessed when select lines $S_1$ and $S_4$ are pulled high and select lines $S_2$ and $S_3$ are pulled low. Note that under these conditions, access is provided to the following memory cells in memory block 100: shared memory cells $ML_0$–$ML_3$, shared memory cells $MR_0$–$MR_3$, and the fourth column of memory cells $M_{0,3}$–$M_{3,3}$. Because each column of shared memory cells counts as a half column within memory block 100, there are effectively two accessed columns within memory block 100 under these conditions.

In the memory array described above, an additional diffusion bit line, metal bit line and select transistor must be added to the left side of each of the left-most memory blocks of the array. This enables the shared memory cells $ML_0$–$ML_3$ of the left-most memory blocks to be accessed. The additional diffusion bit line is coupled to the additional metal bit line through a select transistor. The gate of this select transistor is coupled to select line $S_4$. Similarly, an additional diffusion bit line, metal bit line, and select transistor must be added to the right side of each of the right-most memory blocks of the array, thereby enabling the shared memory cells $MR_0$–$MR_3$ of the right-most memory blocks to be accessed.

In addition to coupling together memory blocks along the first (horizontal) axis, a larger memory block can be formed by elongating diffused regions 101–108 along the second (vertical) axis. However, as discussed below, the resistance of diffused regions 101–108 limits the number of memory cells that can be included in each column.

Access having been provided to all of the memory cells, program, read and erase operations are performed as follows.

For a read operation, the word line associated with the selected memory cell is maintained at the read voltage of 3 volts, while the word lines associated with the non-selected memory cells are held at a voltage of 0 Volts. One of the diffusion bit lines of the selected memory cell is held at a voltage of 2 Volts, and the other diffusion bit line is coupled to a sense amplifier, which is coupled to a voltage of about 0 Volts, such that a reverse read conditions exist for the selected memory cell. For example, to read the right charge trapping region 1 of memory cell $M_{0,2}$, the word line $WL_0$ is held at a voltage of 3 Volts, while the word lines $WL_1$–$WL_3$ are held at 0 Volts. Diffusion bit line 104 is coupled to a sense amplifier (not shown), and a voltage of 2 Volts is applied to diffusion bit line 103, thereby creating reverse read conditions for right charge trapping region 1 of memory cell $M_{0,2}$. Under these conditions, the non-selected memory cells are neither read nor disturbed.

For a program operation, the word line associated with the selected memory cell is held at a programming voltage of 11 volts, while the word lines associated with the non-selected memory cells are held at a voltage of 0 Volts. The source region of the selected memory cell is maintained at a voltage of 0 Volts, and the drain region of the selected memory cell is maintained at a voltage of about 4.5 to 5.5 Volts. For example, to program the right charge trapping region 1 of memory cell $M_{0,2}$, the word line $WL_0$ is held at a voltage of 11 Volts, while the word lines $WL_1$–$WL_3$ are held at 0 Volts. A voltage of about 4.5 to 5.5 Volts is applied to diffusion bit line 104, and a voltage of 0 Volts is applied to diffusion bit line 103, thereby creating a program condition for right charge trapping region 1 of memory cell $M_{0,2}$. The duration of the programming operation is on the order of microseconds. Note that the duration of the programming operation is not long enough and the applied drain voltage of about 4.5 to 5.5 Volts is not high enough to cause the non-selected memory cells to be erased during the programming operation.

An erase operation is performed by disconnecting the gate of a selected memory cell (i.e., allowing the gate to float) and applying 8 Volts to the drain region of the selected memory cell. In general, erase operations in memory block 100 cannot be limited to a single memory cell. For example, the right charge trapping region 1 of memory cell $M_{0,2}$ would be erased as follows. First, the select transistors 110(2) and 120(2) are turned on, thereby providing access to the third column of memory block 100 by coupling metal bit lines 141 and 142 to diffusion bit lines 103 and 104, respectively. An erase voltage of 8 Volts is applied to diffusion bit line 104, and word line $WL_0$ is allowed to float.

Under these conditions, the right charge trapping region 1 of memory cell $M_{0,2}$ is erased. However, under these conditions, the left charge trapping region 2 of the adjacent memory cell $M_{0,3}$ is also erased. Moreover, if the non-selected word lines $WL_1$–$WL_3$ are floating, then the right charge trapping regions of all of the memory cells in the second column and the left charge trapping regions of all of the memory cells in the third column are also erased. Specifically, charge trapping region 3 of memory cell $M_{1,2}$, charge trapping region 5 of memory cell $M_{2,2}$, charge trapping region 7 of memory cell $M_{3,2}$, charge trapping region 4 of memory cell $M_{1,3}$, charge trapping region 6 of memory cell $M_{2,3}$, and charge trapping region 8 of memory cell $M_{3,3}$ are erased. As a result, the erase operation will erase a minimum of 8 bits in the illustrated example. Raising the voltages on the non-selected word lines may eliminate the erase conditions, but may, in turn, create undesirable programming conditions.

To overcome these problems, the memory block 100 is preferably operated as a flash array. However, memory block 100 can also be operated as an EEPROM array utilizing methods disclosed in co-owned and co-pending U.S. application Ser. No. 09/244,529, filed herewith, entitled "EEPROM ARRAY USING 2-BIT NON-VOLATILE MEMORY CELLS AND METHOD OF IMPLEMENTING SAME", which is incorporated herein by reference in its entirety.

Definitions

As used herein, the terms "area efficiency" and "area efficient" refer to the ratio of memory array area to the total area of a memory block. In particular, area efficiency is the ratio produced by dividing the sum of the memory array area (e.g., the area of memory array 130; see FIG. 3) and the column select circuit areas (e.g., the combined areas of column select circuits 110 and 120) by the memory array area. For example, if the combined area for the column select circuits of a memory block is 12 $\mu m^2$, and the memory array covers an area of 32 $\mu m^2$, then the area efficiency of the memory block is approximately 73% (i.e., 32 $\mu m^2$/(12 $\mu m^2$+32 $\mu m^2$). Area efficiency is indicative of the relative density of a memory block. That is, the higher the area efficiency, the greater the number of memory cells per unit of chip area.

Memory Blocks with Metal Jumpers

While memory block 100 of FIG. 3 may be suitable for some EEPROM memory circuits, it is not area efficient. As discussed above, select transistors 110(1)–110(4) and 120(1)–120(4) conduct high voltages, and are therefore significantly larger than memory cells $M_{x,y}$. Specifically, the approximate area required for each select transistor is 6 $\mu m^2$, while the approximate area utilized by each memory cell $M_{x,y}$ is 0.6 $\mu m^2$. Consequently, even though column select circuits 110 and 120 include only a few transistors, the size of column select circuits 110 and 120 significantly affects the area efficiency of memory block 100. When a memory system includes several memory blocks 100 arranged along the first (vertical) axis, the area efficiency of the memory system is relatively low because the column select circuits cover a large portion of the chip. Therefore, there is a need for a column select circuit that minimizes the number of select transistors while maximizing the number of memory cells connected to each diffused region.

In addition, the memory cells of memory block 100 are subjected to a resistance that is determined by the length of diffused regions 101–108. As is understood in the art, the resistance of diffused regions 101–108 is proportional to the signal path length through the diffusion. For example, the resistance between memory cell $M_{0,0}$ and select transistor 110(1) is less than the resistance between memory cell $M_{3,0}$ and select transistor 110(1). Diffusion bit line resistance is significant because, during erasing operations, it causes the source potentials applied to memory cells (e.g., $M_{0,0}$) located near a select transistor (e.g., 110(1)) to differ from the source potentials applied to memory cells (e.g., $M_{3,0}$) located away from the select transistor. This source potential difference causes the memory cells whose source potential is greater/less than zero volts to fail sooner than memory cells whose source 13 potential is equal to zero volts, thereby causing memory block 100 to fail after relatively low number of programming/erasing cycles. Therefore, there is a need for an arrangement that minimizes the diffusion bit line resistance so that the source potential applied to all of the memory cells is as close to zero volts as possible.

Figure 6:
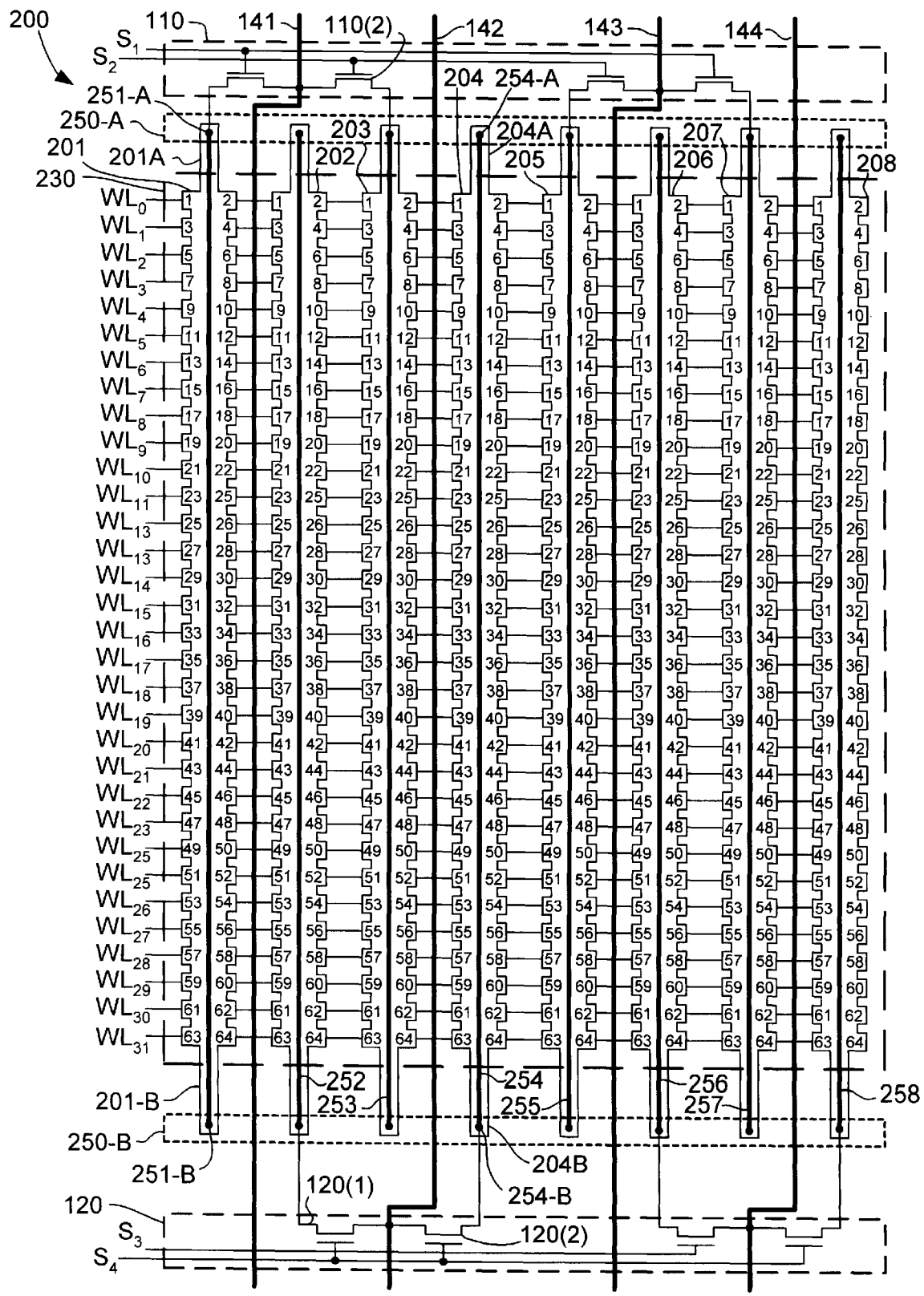
FIG. 6 is a simplified schematic diagram showing a memory block according to a first embodiment of the present invention.

FIG. 6 is a simplified diagram showing a memory block 200 in accordance with a first embodiment of the present invention. Similar to memory block 100, memory block 200 includes a first column select circuit 110, a second column select circuit 120, and an array 230 of 2-bit memory cells identical to 2-bit memory cell 10 (FIG. 2). Column select circuits 110 and 120 are essentially identical to those used in memory block 100 (see FIG. 3). Although not shown in detail, the 2-bit non-volatile memory cells of memory array 230 are connected between elongated diffused regions 201–208 in the manner shown in FIG. 3.

Memory array 230 includes eight elongated diffused regions 201–208 that respectively extend between first (upper) portions and second (lower) portions respectively located adjacent to first and second column select circuits 110 and 120. For example, elongated diffused region 201 extends between a first portion 201A located adjacent to column select circuit 110, and a second portion 201B located adjacent to column select circuit 120. The memory cells of memory array 230 are connected to elongated diffused regions 201–208 between the first and second portions. For explanatory purposes, the charge trapping regions of the memory cells are indicated in FIG. 6 by stepped portions extending from each diffused region. These stepped portions correspond to the connections between the memory cells and the diffused regions that are shown in additional detail in FIG. 3 (i.e., the stepped portions do not represent physical characteristics of the diffused regions). As such, FIG. 6 indicates that memory array includes 32 rows of memory cells accessed by word lines $WL_0$–$WL_{31}$, and each elongated diffused region is connected to 64 charge trapping regions (indicated by reference numbers 1–64). For example, the top row of memory cells includes charge storage regions 1 and 2 connected to diffused regions 201 through 208, which are controlled by word line $WL_0$. Similarly, the bottom row of memory cells includes charge storage regions 63 and 64 that are controlled by word line $WL_{31}$. The remaining rows are arranged in a manner consistent with the top and bottom rows.

By increasing the number of charge storage regions connected to each diffused region 201–208 from eight to 64, the area efficient of memory block 200 is significantly increased over that of memory block 100 because area used for column select circuits 110 and 120 remains constant. Although it would appear that area efficiency is increased simply by increasing the number of charge storage regions connected to each diffused region of a memory array, a problem arises when diffused regions 201–208 become too long. Specifically, the resistance of the diffused regions is proportion to its length, so the strength of signals transmitted the entire length of long diffused regions is reduced more than when shorter diffused regions are used. In other words, the longer the diffused region, the higher the resistance, and the greater the chance of operational error and premature failure due to source potential differences (discussed above).

In accordance with the first embodiment of the present invention, a plurality of metal jumpers 251–258 are connected between the end portions of elongated diffused regions 201–208. Metal jumpers 251–258 extend over diffused regions 201–208, respectively, and are connected by jumper connection structures 250-A and 250-B that include metal vias (vertical connections) between the metal jumpers and the underlying diffused regions. For example, metal jumper 251 is connected by metal vias 251-A and 251-B to first portion 201A and second portion 201B, respectively, of diffused region 201, and extends between first portion 201A and second portion 201B over diffused region 201.

FIGS. 7(A) and 7(B) are partial cross sectional views showing the formation of metal jumpers 251–253 and metal vias 251-A through 253-A. The structures shown in FIGS. 7(A) and 7(B) are representative of the remaining metal jumpers and metal vias of memory block 200. Referring to FIG. 7(A), an insulation (e.g., oxide) layer 710, which has a thickness of approximately 0.6 $\mu m$ is located over doped polycrystalline silicon 156 and metal silicide 157 layer. Metal jumpers 251–253 are formed by a first metal layer on insulation layer 710, and are located over diffused regions 201–203, respectively. Metal bit lines (not shown) may be formed using a second metal layer of the fabrication process. FIG. 7(B) illustrates metal vias 251-A through 253-A that are located in jumper connection structure 250-A. Metal vias 251-A through 253-A extend from metal jumpers 251–253, respectively, through openings formed in insulation layer 710 to contact diffused regions 201–203, respectively.

Referring again to FIG. 6, operation of memory block 200 is essentially the same as that of memory block 100 (see FIG. 3 and above description). For example, in order to read charge trapping region 1 of the memory cell (not shown) connected between diffused regions 203 and 204, the word line $WL_0$ is held at a voltage of 3 Volts, while the word lines $WL_1$–$WL_{31}$ are held at 0 Volts. Diffused region 204 is coupled to a sense amplifier (not shown) via select transistor 120(2) and metal bit line 142, and a voltage of 2 Volts is applied to diffusion bit line 203 from metal bit line 141 through select transistor 110(2), thereby creating reverse read conditions for right charge trapping region 1 of the selected memory cell. Erase and program operations are also performed in the manner described above with reference to memory block 100.

Although operation of memory block 200 is essentially the same as memory block 100, the use of metal jumpers 251–258 in memory block 200 provides an advantage over the jumperless structure of memory block 100 (see FIG. 3) in that metal jumpers 251–258 provide a low resistance path that allows the use of longer diffusion bit lines. It is well know that metal lines produce lower resistances than diffused regions. Because metal jumper 251 has a low resistance relative to diffused region 201, less signal degradation occurs during many read operations that would otherwise require the signal to travel relatively long distances through a diffusion bit line. For example, in the absence of metal jumper 254, signals read from charge trapping region 1 of the memory cell located between diffused regions 203 and 204 must traverse the entire length of diffused region 204 to select transistor 120(2), thereby subjecting the signal to a maximum resistance that is proportional to the length of diffused region 204. In contrast, with metal jumper 253 connected as shown in FIG. 6, signals read from charge trapping region 32 are subjected to a maximum resistance that is proportional to one-fourth of the length of diffused region 204 (note that the resistances of the diffused region sections located above and below charge trapping region 32 are connected in parallel). Consequently, low resistance metal jumper 254 significantly reduces the resistance of diffused region 204 to all 64 charge trapping regions, thereby providing a more uniform signal strength through select transistor 120(2) to metal bit line 144. Although the bit line pitch (i.e., distance between adjacent bit lines) is increased relative to jumperless arrangements due to the use of metal jumpers 251–258, the length of diffused region 201–208 can be greatly increased (up to four times the length of conventional "jumperless" arrangements) without increasing resistance, thereby greatly increasing the number of memory cells in each memory block. Conversely, by forming a relatively short diffusion region, metal jumpers 251–258 significantly reduce diffusion bit line resistance to provide better control of source potentials during erasing operations, thereby increasing the endurance of memory block 200. Therefore, in comparison to jumperless arrangements, metal jumpers 251–258 increase the area efficiency and/or increase the endurance of a memory circuit incorporating memory block 200.

Figure 8:
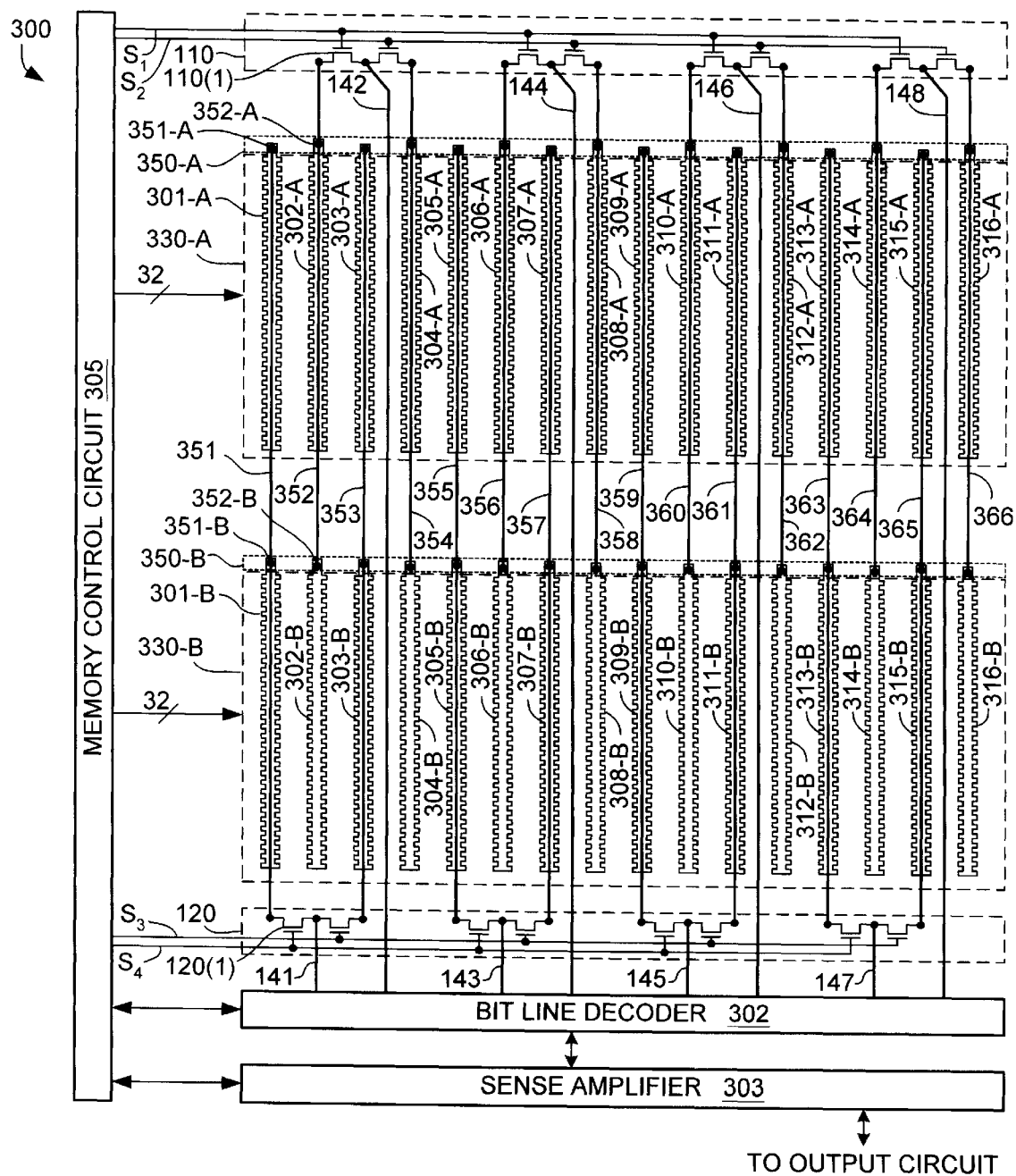
FIG. 8 is a simplified schematic diagram showing a memory circuit according to a second embodiment of the present invention.

FIG. 8 is a simplified diagram of a memory system 300 formed in accordance with a second embodiment of the present invention. Memory system 300 includes bit line decoder circuit 302, a sense amplifier circuit 303 and memory control circuit 305. In addition, similar to memory blocks 100 and 200, memory system 300 includes a first column select circuit 110, a second column select circuit 120, and memory arrays 330-A and 330-B including 2-bit memory cells identical to 2-bit memory cell 10 (FIG. 2). Column select circuits 110 and 120 are similar to those used in memory block 100 (see FIG. 3), and are connected to metal bit lines 141–148. Although not shown in detail, the 2-bit non-volatile memory cells of memory arrays 330-A and 330-B are connected in a manner similar to that shown in FIG. 3.

Memory control circuit 305 generates control signals that selectively access the memory cells of memory arrays 330-A and 330-B during read, erase and program operations.

Memory control circuits that generate word line and bit line signals in response to input address data are well known. Memory control circuit 305 is similar to these well-known circuits, and is therefore not discussed in detail herein. Thirty-two word lines are connected between memory control circuit 305 and each memory array 330-A and 330-B. Select signals are transmitted to column select circuits 110 and 120 on select lines $S_1$–$S_4$. As discussed above, these select signals facilitate data signal transmissions on metal bit lines 141–148 between memory arrays 330-A and 330-B. For example, during read operations, data signals read from selected charge trapping regions are transmitted via column select circuits 110 and 120 and metal bit lines 141–148 to bit line decoder circuit 302. Bit line decoder circuit 302 is controlled to route a predetermined set of bit line signals to sense amplifier circuit 303 in response to a column address received from memory control circuit 305. Bit line decoder 302 is described in additional detail in co-owned and co-pending U.S. application Ser. No. 09/243,976, entitled "COLUMN DECODER FOR AN EEPROM ARRAY USING 3-BIT NON-VOLATILE MEMORY CELLS", which is incorporated herein by reference in its entirety. Sense amplifier circuit 303 is coupled to an output circuit for transmitting signals from memory system 300. Such output circuits are well known, and are therefore not discussed in detail herein.

Memory arrays 330-A and 330-B collectively include thirty-two separate elongated diffused regions 301-A through 316-A and 301-B through 316-B, respectively, that are arranged in two rows. Each of diffused regions 301-A through 316-A includes a first (upper) portion located in a first jumper connection region 350-A, and a second (lower) portion. Note that the second (lower) portions of diffused regions 301-A through 316-A are not connected to diffused regions 301-B through 316-B. Each of diffused regions 301-B through 316-B include a first (upper) portion located in second jumper connection region 350-B, and a second (lower) portion.

In accordance with the second embodiment, a plurality of metal jumpers 351-366 are connected to the first (upper) portions of elongated diffused regions 301-A through 316-A and 301-B through 316-B, respectively. For example, metal jumper 351 is connected to the first (upper) portion of elongated diffused region 301-A by metal via 351-A, and to the first (upper) portion of elongated diffused region 301-B by metal via 351-B. Therefore, both elongated diffused regions 301-A and 301-B are connected to metal bit line 141 via select transistor 120(1). Similarly, metal jumper 352 is connected to the first (upper) portion of elongated diffused region 302-A by metal via 352-A, and to the first (upper) portion of elongated diffused region 302-B by metal via 352-B. Therefore, both elongated diffused regions 302-A and 302-B are connected in parallel by metal bit line 142 to select transistor 110(1).

Although each elongated diffused regions 301-A through 316-A and 301-B through 316-B is connected to its corresponding metal jumper at only one point, memory block 300 provides many advantages over jumperless arrangements.

First, by carefully selecting the length of each elongated diffused region, the signal degradation (resistance) problem can be optimized for each diffused region. That is, by limiting the length of each diffused region, signals read from the second (lower) portions of each diffused region incur a predictable amount of resistance during transmission to the metal via connected at the first (upper) portion of the diffused region. With the length of each elongated diffused region optimized, large memory blocks can be formed by arranging multiple memory arrays in the manner shown in FIG. 8. For example, instead of two memory arrays 330-A and 330-B, a large memory block may include six, eight or more memory arrays connected to metal jumpers 351 through 366. Consequently, data is read from a large number of memory cells using only column select circuits 110 and 120, thereby greatly increasing the area efficiency of memory block 300 over jumperless arrangements.

Figure 9A:
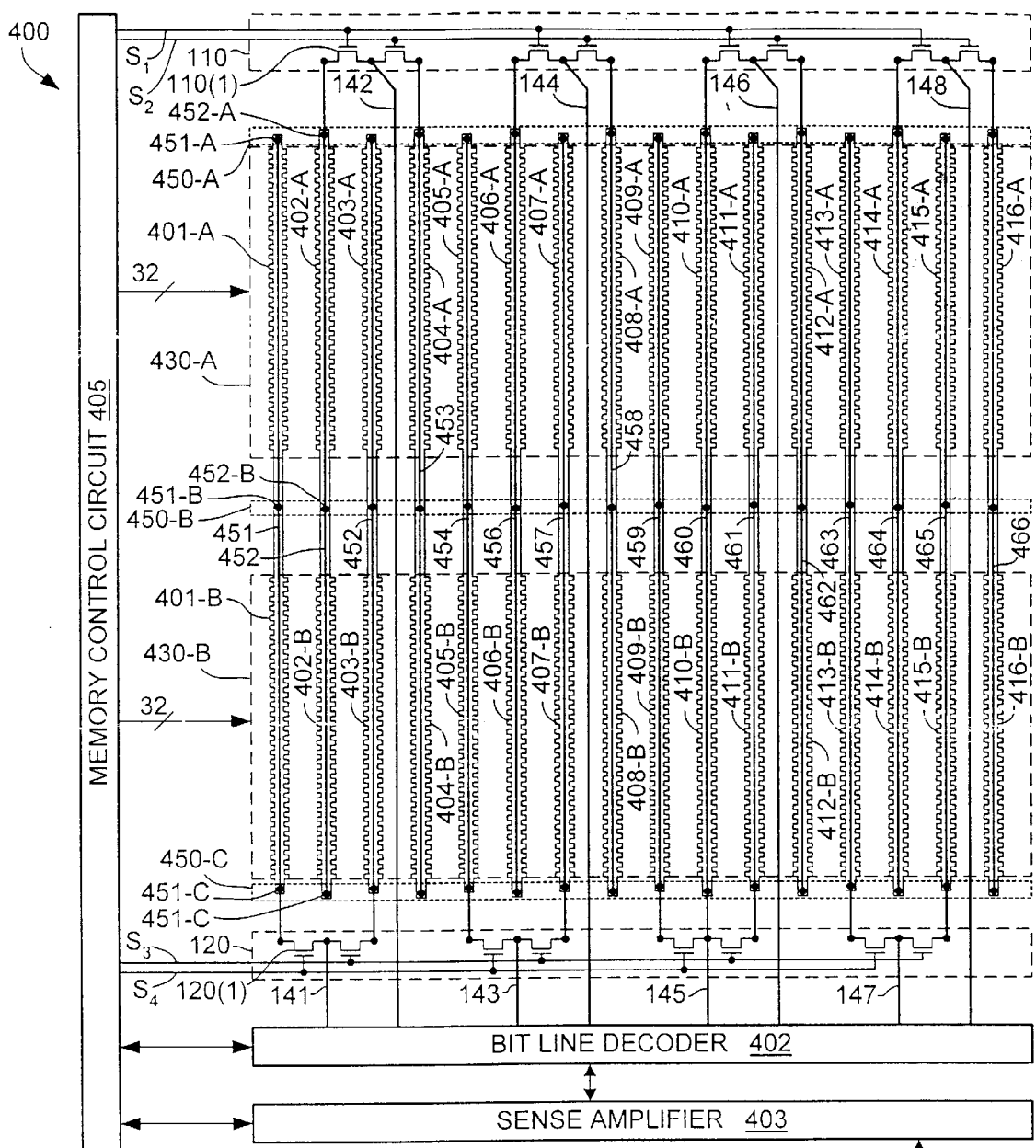
FIGS. 9(A) and 9(B) are simplified diagrams showing a memory circuit according to a third embodiment of the present invention.

FIG. 9(A) is a simplified diagram of a memory system 400 formed in accordance with a second embodiment of the present invention. Memory system 400 includes bit line decoder circuit 402, a sense amplifier circuit 403 and memory control circuit 405. Similar to memory blocks 100 and 200, memory system 400 includes a first column select circuit 110, a second column select circuit 120, and memory arrays 430-A and 430-B including 2-bit memory cells identical to 2-bit memory cell 10 (FIG. 2). Column select circuits 110 and 120 are similar to those used in memory block 100 (see FIG. 3), and are connected to metal bit lines 141–148. Although not shown in detail, the 2-bit non-volatile memory cells of memory arrays 430-A and 430-B are connected in a manner similar to that shown in FIG. 3.

Memory arrays 430-A and 430-B include elongated diffused regions 401-A through 416-A and 401-B through 416B, respectively, that are linked to form a continuous diffusion region that extends from a first (upper) portion located between memory array 430-A and first column select circuit 110, and a second (lower) portion located between memory array 430-B and second column select circuit 120. Each diffused regions 401-A through 416-A includes a first (upper) portion located in a first jumper connection region 450-A, and a second (lower) portion that extends to a second jumper connection region 450-B. Each of diffused regions 401-B through 416-B include a first (upper) portion located in second jumper connection region 450-B, and a second (lower) portion that extends to a third jumper connection region 450-C. Thus, portions of diffused region extend between first elongated diffused regions 401-A through 416-A and second elongated diffused regions 401-B through 416-B, respectively, to connect these regions. Note that the intermediate portions extending between the first and second diffused regions are elongated for explanatory purposes.

In accordance with the third embodiment, a plurality of metal jumpers 451–466 are connected between the first (upper) portions of elongated diffused regions 401-A through 416-A, respectively, and the second (lower) portions of elongated diffused regions 401-B through 416-B, respectively, and are also connected to the diffused region portions extending between elongated diffused regions 401-A through 416-A and diffused regions 401-B through 416-B. For example, metal jumper 451 is connected to the first (upper) portion of elongated diffused region 401-A by metal via 451-A, to a point located between diffused regions 401-A and 401-B by metal via 451-B, and to the second (lower) portion of elongated diffused region 401-B by metal via 451-C. Therefore, both elongated diffused regions 401-A and 401-B are connected to metal bit line 141 via select transistor 120(1). Similarly, metal jumper 452 is connected to the first (upper) portion of elongated diffused region 402-A by metal via 452-A, to a point located between diffused regions 402-A and 402-B by metal via 451-B, and to the second (lower) portion of elongated diffused region 402-B by metal via 452-C. Therefore, both elongated diffused regions 402-A and 402-B are connected to metal bit line 142 via select transistor 110(1).

Figure 9B:
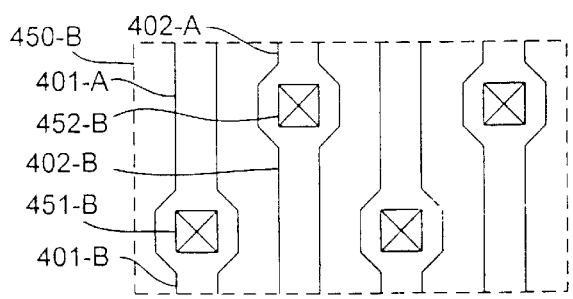

FIG. 9(B) is a partial plan view showing second jumper connection region 450-B in additional detail. As indicated, metal vias 451-B and 452-B, which are respectively connected to diffused region portions connected between diffused regions 401-A and 401-B and between diffused regions 402-A and 402-B, are formed in a staggered arrangement to minimize the bit line pitch (i.e., minimize the distance between diffused regions 401-A and 402-A). For example, metal via 452-B is located closer to diffused region 402-A than to diffused region 402-B, and metal via 451-B is located closer to diffused region 401-B than to elongated diffused region 401-A, thereby establishing a staggered arrangement. The metal vias in first and third jumper connection regions 450-A and 450-C are formed in a similar staggered arrangement.

Because each elongated diffused regions 401-A through 416-A and 401-B through 416-B is connected to its corresponding metal jumper at both ends, memory block 400 provides the advantages discussed above with reference to memory block 200. Specifically, large memory blocks can be formed by arranging multiple memory arrays in the serial manner shown in FIG. 9(A). For example, instead of two memory arrays 430-A and 430-B, a large memory block may include six, eight or more memory arrays connected in series by metal jumpers 451 through 466. Compared to the second embodiment shown in FIG. 8, the arrangement shown in FIG. 9(A) allows four times as many memory cells. Consequently, data is read from a large number of memory cells using only column select circuits 110 and 120, thereby maximizing the area efficiency of memory block 400.

FIG. 10 is a plan view showing portions of first column select circuit 110-A and jumper connection circuit X50-A according to an embodiment of the present invention. The letter "X" is used herein to reference any of the memory blocks 200, 300 and 400 that are discussed above. Shading is used in FIG. 10 to indicate diffusion (conductive) regions of a semiconductor (e.g., silicon) substrate.

Column select circuit 110-A includes a first diffusion 1010, a second diffusion 1020 and a third diffusion 1030. Select line $S_1$, which is polysilicon, is located over a channel provided between first diffusion 1010 and second diffusion 1020, thereby forming first select transistor 110(1) (see FIGS. 6, 8 and 9). Similarly, polysilicon select line S2 is located over a channel separating third diffusion 1030 and second diffusion 1020, thereby forming second select transistor 110(2) (see FIGS. 6, 8 and 9). Metal portions 1040, 1050 and 1060 are formed over diffusions 1010, 1020 and 1030, respectively. Metal vias 1045, 1055 and 1065 connect metal portions 1040, 1050 and 1060 to diffusions 1010, 1020 and 1030, respectively.

Jumper connection circuit X50-A includes first (upper) portions of elongated diffused regions X01-A through X04-A, first (upper) portions of metal jumpers X51 through X54, and metal vias X51-A through X54-A that are connected between elongated diffused regions X01-A through X04-A and metal jumpers X51 through X54, respectively. Finally, metal jumper X52 is connected to metal portion 1040 of column select structure 110 by a metal extension 1047, and metal jumper X54 is connected to metal portion 1060 by a metal extension 1067.

FIG. 11 is a plan view showing a combined column select circuit 110-B that includes a jumper connection structure according to an alternative embodiment of the present invention. By incorporating the jumper connection structure within column select circuit 110-B, the overall size of column select circuit 110-B is minimized, thereby maximizing the area efficiency of a memory circuit utilizing column select circuit 110-B.

Column select circuit 110-B includes a first diffusion 1110, a second diffusion 1120 and a third diffusion 1130. Select line $S_1$, which is polysilicon, is located over a channel provided between first diffusion 1110 and second diffusion 1120, thereby forming first select transistor 110(1) (see FIGS. 6, 8 and 9). Similarly, polysilicon select line $S_1$ is located over a channel separating third diffusion 1130 and second diffusion 1120, thereby forming second select transistor 110(2) (see FIGS. 6, 8 and 9). Metal portions 1140 and 1160 are formed over diffusions 1110 and 1130, respectively. Metal vias 1145 and 1165 connect metal portions 1140 and 1160 to diffusions 1110 and 1130, respectively. An additional metal via 1155 connects diffusion 1120 to a metal signal line (not shown) that is formed from, for example, a second metal layer. Finally, metal jumper X52 is connected to metal portion 1140 of column select structure 110 via a metal extension 1147, and metal jumper X54 is connected to metal portion 1160.

Although the invention has been described in connection with several embodiments, it is understood that this invention is not limited to these embodiments, but is capable of various modifications that would be apparent to a person skilled in the art. Thus, the invention is limited only by the following claims.

What is claimed is:

1. An area efficient 2-bit non-volatile memory array comprising:
   a first metal bit line;
   a first select transistor having a first terminal connected to the first metal bit line and a second terminal;
   a first elongated diffused region having a first portion connected to the second terminal of the first select transistor, and a second portion;
   a plurality of 2-bit non-volatile memory cells located between the first and second portions of the first elongated diffused region, each of the plurality of 2-bit non-volatile memory cells having a terminal connected to the first elongated diffused region; and
   a first metal jumper connected between the first and second portions of the first elongated diffused region.

2. The memory array according to claim 1, wherein the first metal jumper extends over the first elongated diffused region between the first portion and the second portion, and wherein an insulation material is located between the first metal jumper and the first elongated diffused region.

3. The memory array according to claim 1 further comprising:
   a second metal bit line;
   a second select transistor having a first terminal connected to the second metal bit line and a second terminal; and
   a second elongated diffused region connected to the second terminal of said second select transistor, the second elongated diffused region including a first portion located adjacent to the first portion of the first elongated diffused region, and a second portion located adjacent to the second portion of the first elongated diffused region;
   a second metal jumper connected between the first and second portions of the second elongated diffused region.

4. The memory array according to claim 3, wherein the second elongated diffused region is connected to the second select transistor at a point located adjacent to the second portion of the second elongated diffused region.

5. The memory array according to claim 4, wherein the plurality of 2-bit non-volatile memory cells are connected between the first elongated diffused region and the second elongated diffused region.

6. The memory array according to claim 5,
   wherein each of the 2-bit non-volatile memory cells includes an oxide-nitride-oxide structure extending between the first elongated diffused region and the second elongated diffused region,
   wherein a plurality of polysilicon word line structures are located over the plurality of 2-bit non-volatile memory cells, and
   wherein the first and second metal jumpers comprise metal line structures located over the plurality of polysilicon word line structures.

7. The memory array according to claim 6, further comprising a metal via structure connected between the first metal jumper and the first elongated diffused region, the metal line structure extending through an oxide layer located over the first elongated diffused region.

8. An area efficient 2-bit non-volatile memory array comprising:
   a first metal bit line;
   a first select transistor having a first terminal connected to the metal bit line and a second terminal;
   a first elongated diffused region having a first portion connected to the second terminal of the first select transistor, and a second portion;
   a first plurality of 2-bit non-volatile memory cells located between the first and second portions of the first elongated diffused region, each of the plurality of 2-bit non-volatile memory cells having a terminal connected to the elongated diffused region;
   a second elongated diffused region having a first portion and a second portion;
   a second plurality of 2-bit non-volatile memory cells located between the first and second portions of the second elongated diffused region, each of the plurality of 2-bit non-volatile memory cells having a terminal connected to the elongated diffused region; and
   a first metal jumper connected between the first portion of the first elongated diffused region and the first portion of the second elongated diffused region.

9. The memory array according to claim 8, wherein the first metal jumper extends over the first elongated diffused region, and wherein an insulation material is located between the first metal jumper and the first elongated diffused region.

10. The memory array according to claim 8 further comprising:
    a second metal bit line;
    a second select transistor having a first terminal connected to the second metal bit line and a second terminal;
    a third elongated diffused region connected to the second terminal of said second select transistor, the third elongated diffused region including a first portion located adjacent to the first portion of the second elongated diffused region, and a second portion located adjacent to the second portion of the second elongated diffused region;
    a fourth elongated diffused region including a first portion located adjacent to the first portion of the first elongated diffused region, and a second portion located adjacent to the second portion of the first elongated diffused region;

a second metal jumper connected between the first portion of the fourth elongated diffused region and the first portion of the third elongated diffused region, wherein the second metal jumper is also connected to the second terminal of the second select transistor.

11. The memory array according to claim 10, wherein the first plurality of 2-bit non-volatile memory cells are connected between the first elongated diffused region and the fourth elongated diffused region, and wherein the second plurality of 2-bit non-volatile memory cells are connected between the second elongated diffused region and the third elongated diffused region.

12. The memory array according to claim 11,
wherein each of first plurality of 2-bit non-volatile memory cells includes an oxide-nitride-oxide structure extending between the first elongated diffused region and the fourth elongated diffused region,
wherein a plurality of polysilicon word line structures are located over the first plurality of 2-bit non-volatile memory cells, and
wherein the first and second metal jumpers comprise metal line structures located over the plurality of polysilicon word line structures.

13. An area efficient 2-bit non-volatile memory array comprising:
a first metal bit line;
a first select transistor having a first terminal connected to the metal bit line and a second terminal;
a first elongated diffused region having a first portion connected to the second terminal of the select transistor, and a second portion;
a first plurality of 2-bit non-volatile memory cells located between the first and second portions of the first elongated diffused region, each of the plurality of 2-bit non-volatile memory cells having a terminal connected to the elongated diffused region;
a second elongated diffused region having a first portion and a second portion;
a second plurality of 2-bit non-volatile memory cells located between the first and second portions of the second elongated diffused region, each of the plurality of 2-bit non-volatile memory cells having a terminal connected to the elongated diffused region; and
a third diffused region connected between the second portion of the first elongated diffused region and the first portion of the second elongated diffused region; and
a first metal jumper connected to the first portion of the first elongated diffused region, to the second portion of the second elongated diffused region, and to the third diffused region.

14. The memory array according to claim 13, wherein the first metal jumper extends over the first and second elongated diffused regions, and wherein an insulation material is located between the first metal jumper and the first and second elongated diffused regions.

15. The memory array according to claim 13 further comprising:
a second metal bit line;
a second select transistor having a first terminal connected to the second metal bit line and a second terminal;
a fourth elongated diffused region connected to the second terminal of said second select transistor, the fourth elongated diffused region including a first portion located adjacent to the first portion of the second elongated diffused region, and a second portion located adjacent to the second portion of the second elongated diffused region;
a fifth elongated diffused region including a first portion located adjacent to the first portion of the first elongated diffused region, and a second portion located adjacent to the second portion of the first elongated diffused region;
a sixth diffused region connected between the first portion of the fourth elongated diffused region and the second portion of the fifth elongated diffused region; and
a second metal jumper connected to the second portion of the fourth elongated diffused region, to the first portion of the fifth elongated diffused region, and to the sixth diffused region.

16. The memory array according to claim 15, wherein the first plurality of 2-bit non-volatile memory cells are connected between the first elongated diffused region and the fifth elongated diffused region, and wherein the second plurality of 2-bit non-volatile memory cells are connected between the second elongated diffused region and the fourth elongated diffused region.

17. The memory array according to claim 16,
wherein each of first plurality of 2-bit non-volatile memory cells includes an oxide-nitride-oxide structure extending between the first elongated diffused region and the fifth elongated diffused region,
wherein a plurality of polysilicon word line structures are located over the first plurality of 2-bit non-volatile memory cells, and
wherein the first and second metal jumpers comprise metal line structures located over the plurality of polysilicon word line structures.

18. The memory array according to claim 17, further comprising a first metal via structure connected between the first metal jumper and the third elongated diffused region and a second metal via structure connected between the second metal jumper and the sixth elongated diffused region,
wherein the first metal via structure is located closer to the first elongated diffused region than to the second elongated diffused region, and
wherein the second metal via structure is located closer to the fourth elongated diffused region than to the fifth elongated diffused region.

* * * * *